(12) United States Patent
Ter-Hovhannissian

(10) Patent No.: US 8,661,660 B2
(45) Date of Patent: *Mar. 4, 2014

(54) PROCESS FOR MANUFACTURING LED LIGHTING WITH INTEGRATED HEAT SINK

(75) Inventor: Artak Ter-Hovhannissian, Glendale, CA (US)

(73) Assignee: The Artak Ter-Hovhanissian Patent Trust, Woodland Hills, CA (US)

( * ) Notice: Subject to any disclaimer, the term of this patent is extended or adjusted under 35 U.S.C. 154(b) by 1020 days.

This patent is subject to a terminal disclaimer.

(21) Appl. No.: 12/490,230

(22) Filed: Jun. 23, 2009

(65) Prior Publication Data

US 2010/0240158 A1    Sep. 23, 2010

Related U.S. Application Data

(63) Continuation-in-part of application No. 11/162,783, filed on Sep. 22, 2005, now Pat. No. 7,676,915.

(51) Int. Cl.
*H01R 9/00* (2006.01)
*H05K 3/00* (2006.01)

(52) U.S. Cl.
USPC ................................ 29/843; 29/846; 257/707

(58) Field of Classification Search
USPC ........ 257/81, 88, 98, 707, E25.028, E23.075; 362/249.02, 294, 373, 547, 800; 361/717; 430/278.1; 29/832, 840, 842, 29/843, 846, 726, 890.03, 890.039

See application file for complete search history.

(56) References Cited

U.S. PATENT DOCUMENTS

| | | | |
|---|---|---|---|
| 4,729,076 A | 3/1988 | Masami et al. | |
| 5,857,767 A | 1/1999 | Hochstein | |
| 6,222,207 B1 * | 4/2001 | Carter-Coman et al. | 257/98 |
| 6,318,886 B1 * | 11/2001 | Stopa et al. | 362/800 |
| 7,196,459 B2 * | 3/2007 | Morris | 362/294 |
| 7,676,915 B2 * | 3/2010 | Ter-Hovhannissian | 29/840 |
| 2003/0156410 A1 | 8/2003 | Ter-Hovhannisian | |
| 2004/0063033 A1 * | 4/2004 | Hotta | 430/278.1 |

* cited by examiner

*Primary Examiner* — Donghai D. Nguyen
(74) *Attorney, Agent, or Firm* — Kelly & Kelley, LLP

(57) ABSTRACT

A method for manufacturing an LED lamp assembly includes anodizing at least a portion of a surface of an electrically and thermally conductive base, such as an aluminum or aluminum alloy base, so as to form an electrically insulating coating. The base may form a heat sink or be coupled to a heat sink. The anodized surface is chemically etched and circuit traces that include an LED landing are formed on the etched anodized surface. LEDs are electrically and mechanically attached to the LED landing by way of conductive metallic solder such that heat generated from the LED is transferred efficiently through the solder and LED landing to the base and heat sink through a metal-to-metal contact pathway.

22 Claims, 8 Drawing Sheets

PROCESS FOR MANUFACTURING LED LIGHTING WITH INTEGRATED HEAT SINK

RELATED APPLICATION

This application is a continuation-in-part of application Ser. No. 11/162,783 filed on Sep. 22, 2005, now U.S. Pat. No. 7,676,91.

BACKGROUND OF THE INVENTION

The present invention generally relates to light emitting diode arrays. More particularly, the present invention relates to a light emitting diode (LED) lamp assembly manufactured in such a manner so as to have an integrated heat sink to avoid degrading temperatures otherwise created by the light emitting diodes.

Light emitting diodes (LEDs) have been available since the early 1960s in various forms, and are now widely applied in a variety of ways, including signs and message boards, vehicle lights, and even interior lights. The relatively high efficiency of LEDs is the primary reason for their popularity. Tremendous power savings are possible when LEDs are used to replace traditional incandescent lamps of similar luminous output.

One aspect of high powered LED technology that has not been satisfactorily resolved is the removal of heat generated by the LED. LED lamps exhibit a substantial light output sensitivity to temperature, and in fact are permanently degraded by excessive temperature. Recently, very high performance LEDs have been commercialized. However, these LEDs emit a substantial amount of heat during their operation, which can permanently degrade the LED over time, resulting in a lower output and operating life. In ideal conditions, the life of the LED is 50,000-100,000 hours, however, this life can be shortened to less than 10% of the designed life due to the heat generated by these new super bright LEDs. Until recently, the higher light output was the trade-off for the shortened life due to the heat it generated.

To maximize the life of LEDs a heat sink coupled to the LEDS has been increasingly used. For example, aluminum or metal core printed circuit boards (PCB) have been used. These PCBs have a dielectric layer on top of the metal surface which acts as an electrical insulator between the circuitry and the metal base. The circuit traces are then formed on top of the dielectric, and the electronic components attached thereto. There are several ways to manufacture a metal core PCB. For example, thin FR4 or fiberglass circuit board that already has the circuitry printed onto it is mounted onto a metal substrate. Another method is to print the circuitry onto the dielectric material after it has already been mounted onto the metal substrate. U.S. Pat. No. 4,729,076 to Masamai et al., discloses an LED lamp assembly wherein a heat absorber, in the form of an electrically insulating sheet, is disposed between the circuit board holding the LEDs and the heat sink.

However, these arrangements have several disadvantages. These PCBs still have thermal conductivity problems when used with high output LEDs, and do not perform well due to core thermal conductivity of the dielectric. When the LED is attached to a standard PCB, the heat is trapped under the LED due to the low thermal conductivity of the fiberglass circuit board, insulating sheet, etc.

U.S. Pat. No. 5,857,767 discloses an LED assembly wherein an insulating coating is disposed over an aluminum heat sink. Circuit traces are printed on the insulating layer and the leads of the LEDs are adhesively secured to the circuit traces to hold the LEDs in position. As disclosed by the '767 patent, the electrically conductive adhesive comprises an organic polymeric material compounded with a metal.

However, the adhesive attachment of the heat sink LEDs to the metallic heat sink in this manner, while an improvement of the other methods, still presents some disadvantages. The organic conductive adhesive does not conduct heat as well as metal. Thus, once again, heat can be trapped under the LED. LEDs typically include a heat sink slug in a central portion thereof immediately below the light emitting chip. Other components surrounding the light emitting chip are typically plastic or silicon and not intended to transmit the heat away from the chip. Attaching the bottom of the LED to the circuit traces with an adhesive serves to trap the heat within the LED.

Another disadvantage is that adhesive attachment systems sometimes exhibit detachment due to repeated temperature cycles. The relatively large differences in thermal expansion coefficients of plastics, epoxies and metals can give rise to substantial stresses of the attachment region. These stresses may exceed the strength of the adhesive and may eventually result in joint failure. This could result in the LED being electrically disconnected from the circuit.

Accordingly, there is a continuing need for a method of manufacturing LED assemblies in order to achieve the desired heat rejection from the LED. In order to utilize the inherent low temperature resistance that is available in the newer generation of high performance LEDs, special attention must be given to the attachment of these LEDs to the heat dissipater. The present invention fulfills these needs and provides other related advantages.

SUMMARY OF THE INVENTION

The present invention resides in an LED assembly which is designed to manage and remove the heat generated by the LED lamps to the greatest extent possible. The method for manufacturing such an LED lamp assembly in accordance with the present invention generally comprises anodizing at least a portion of a surface of an electrically and thermally conductive base so as to form an electrically insulating coating. Typically, the base is comprised of aluminum or an aluminum alloy. Thus, the anodizing step includes the step of forming an aluminum oxide coating on the base. This anodized layer is chemically etched by dipping the base in a chemical etchant such as isoprep. After being etched, the base can be dried in a oven to remove excess moisture.

Circuit traces are formed on the anodized surface of the base to establish discreet and electrically conductive paths for electrically interconnecting electronic components. The circuit traces include at least one LED landing. The base is then baked in an oven to cure the material forming the circuit traces and LED landing. The oven is preferably set at about 175° C. and the base is baked for about thirty minutes.

An LED is then electrically and mechanically attached to the LED landing by means of conductive metallic solder. Thus, heat generated from the LED is transferred through the metallic solder and circuit LED landing to the thermally conductive base. Due to the fact that the solder comprises a conductive metallic material, such as a tin alloy material comprising tin and lead, copper or silver, heat transfer from the LED is maximized as it flows from the metallic LED heat sink slug to the solder, through the circuit traces and into the base.

In one embodiment of the invention, the base comprises a heat sink. The base may have heat dissipating fins formed thereon. Typically, the fins extend from a surface of the base generally opposite the circuit traces.

In another embodiment, the aluminum base is coupled to a metallic heat sink. This typically includes the step of disposing a heat conductive material, such as a metallic-based paste, between the base and the heat sink, which are fastened together.

Typically, a lens and reflector disposed over the LED, which cooperatively disperse the light emitted from the LED.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

As shown, in the accompanying drawings, for purposes of illustration, the present invention resides in an LED lamp assembly, and particularly in a method for manufacturing these in such a way to remove the heat generated by the LEDs in an efficient manner. When referring to the Figures, like numerals indicate like or corresponding parts throughout several views.

Figure 1:
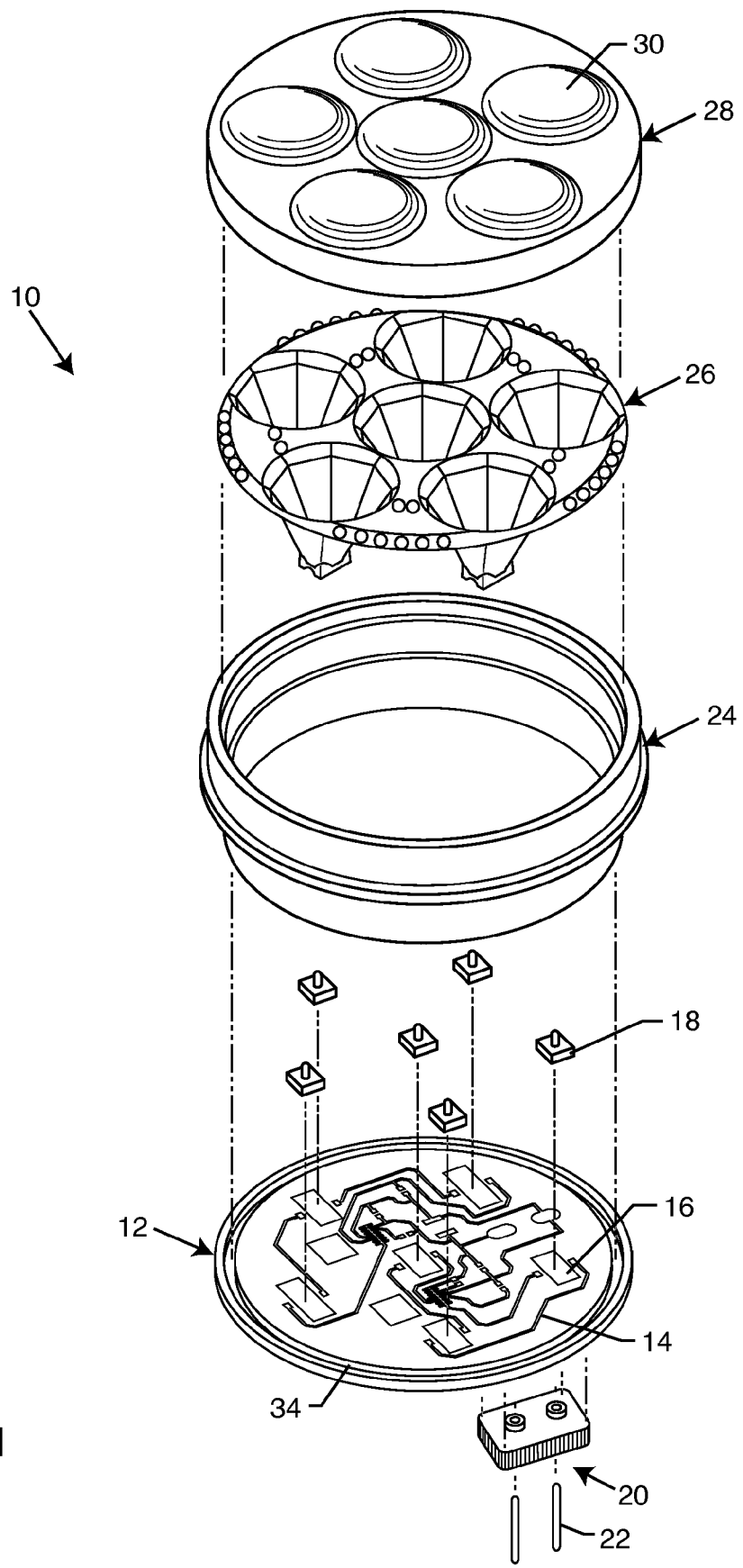
FIG. 1 is an exploded perspective view of a lamp assembly manufactured in accordance with the present invention.

With reference now to FIG. 1, an LED lamp assembly, generally referred to by the reference number 10, embodying the present invention is shown. The assembly 10 includes an electrically and thermally conductive base 12. The base 12 includes a very thin electrically insulating coating, on at least a portion of the surface thereof. Typically, the base 12 is comprised of a metal material with at least a portion of a top surface thereof anodized. For example, the base 12 is typically comprised of aluminum or an aluminum alloy.

Aluminum is a superb thermal conductor, being 90% more thermally conductive than a traditional PCB, and costing 80% less to produce than prior art metal core PCBs. By anodizing the aluminum, a very thin layer of the surface becomes a dielectric in the form of an aluminum oxide film. The aluminum oxide film could be as thin as 3 microns. Such anodized coating is extremely adherent and offers excellent thermal conductance and acceptable puncture voltage so as to serve as an electrically insulating coating to the underlying aluminum or aluminum alloy material which is electrically conductive.

Circuit traces 14 are formed on the anodized surface or portions of the base 12. Such circuit traces 14 are disposed in predetermined spaced lengths along determined routes to prevent electrical conduction between traces 14, while interconnecting the various electrical components used in the lamp assembly 10. The circuit traces 14 can be placed onto the base 12 by several different methods. For example, one method is to print the circuit traces 14 using conventional methods used to make PCBs. Another method is to vacuum metallize the circuitry image onto the base 12. Yet another method is to plate the circuitry image onto the anodized aluminum base 12 by using conventional technique used in gold or silver plating. The circuit traces 14 also include LED landings 16 sized and configured so as to receive an LED 18 thereon. It will be appreciated by those skilled in the art that the circuit traces 14 and LED landing 16 are comprised of a conductive metal or metal alloy, such as silver, gold, copper, etc. Such circuit traces are electrically and thermally conductive.

The LEDs 18 each have electrical leads (not shown). The LEDs 18 typically comprise surface mounted LEDs with either flat or formed leads which can be placed on their respective positions on the LED landing 16 of the circuit trace array 14.

Means for supplying power to the circuit traces 14 add electronic components, including the LEDS 18, is also provided, such as the illustrated electrical plug 20 having conductive prongs 22 designed to be inserted into an appropriate socket. The illustrated LED lamp assembly 10 could comprise a vehicle tail-light assembly, wherein the base 12 could be plugged into a socket of the vehicle. Alternatively, as will be appreciated by those skilled in the art, electrical leads in the form of wires or the like could be used to provide electricity to the circuit traces and electronic components thereof.

The assembly 10 typically includes a housing 24 which at least partially surrounds the base 12 for protection and mounting purposes. Preferably, the housing 24 is comprised of a thermally conductive material, such as metal. As will be more fully described herein, the heat generated by the LEDs 18 is transferred to the base 12, which may comprise a heat sink as illustrated in FIGS. 3-7. In the event that the housing 24 is comprised of a metal or other thermally conductive material, the heat could be further transferred from the base 12 to the housing 24 for further heat dissipation. However, the housing 24 could be comprised of a plastic or other non-thermally conductive material as well. The base 12 and housing 24 are illustrated herein as being generally circular, although it will be understood that the invention is not limited to such a configuration.

The LED lamp assembly 10 also preferably includes a reflector 26 designed to reflect the light emitted from the LEDs 18. A lens 28 is also typically disposed over the housing 24 and LEDS 18. In a particularly preferred embodiment, the lens 28 includes additional reflectors 30, which cooperatively work with the reflector 26 in dispersing the fairly narrow beam of light generated from the LED 18. Such is disclosed by U.S. Application Publication Number US2003/0156410, the contents of which are incorporated by reference herein.

Figure 2:
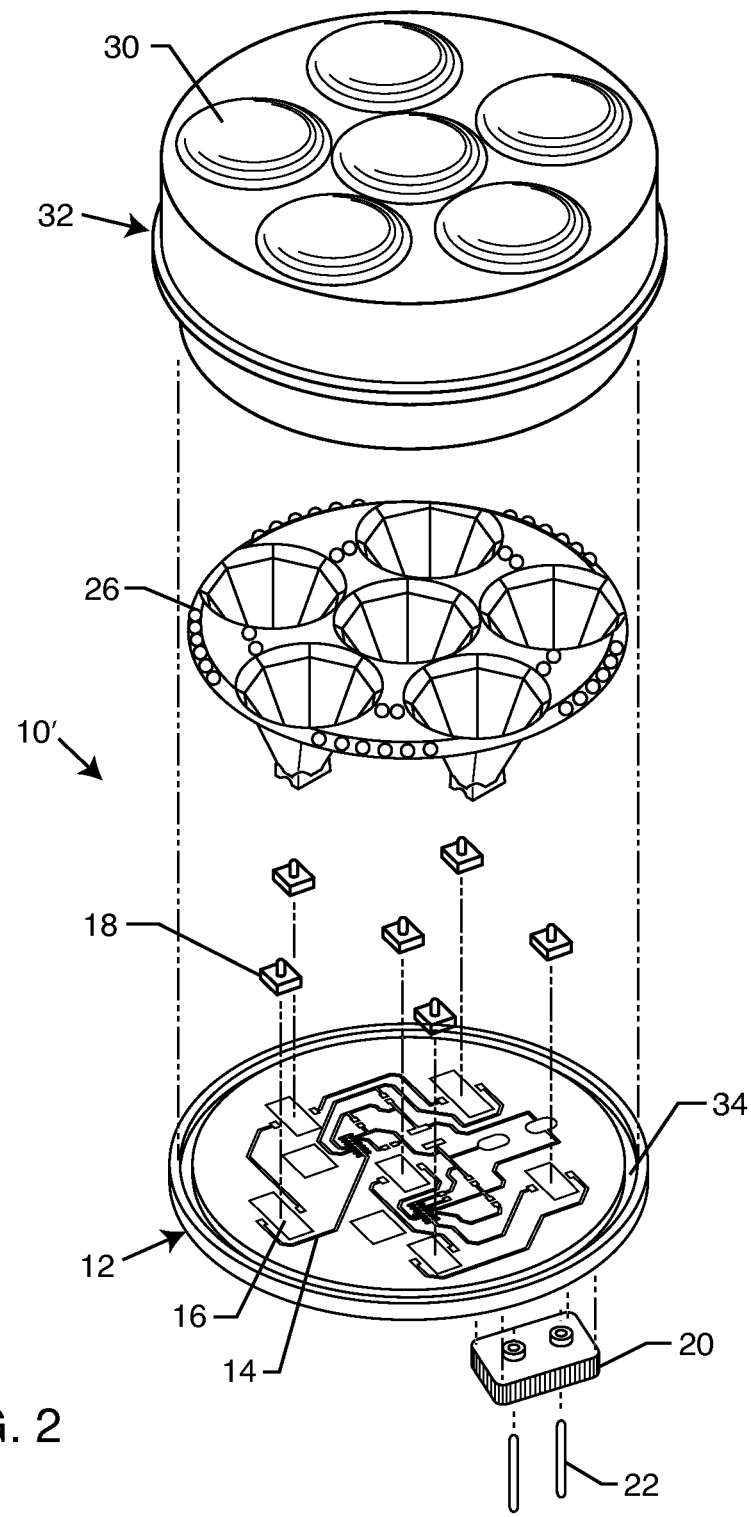
FIG. 2 is an exploded perspective view of an alternative embodiment, wherein a housing and lens thereof form a single piece.

With reference now to FIG. 2, another embodiment of the present invention is illustrated, wherein the lens and housing are formed as an integral unit 32. In either of the embodiments, the housing 24 or combination lens/housing 32 is mountable or otherwise attachable the base 12, such as by threaded or adhesive connection to a channel 34 of the base 12.

Figure 3:
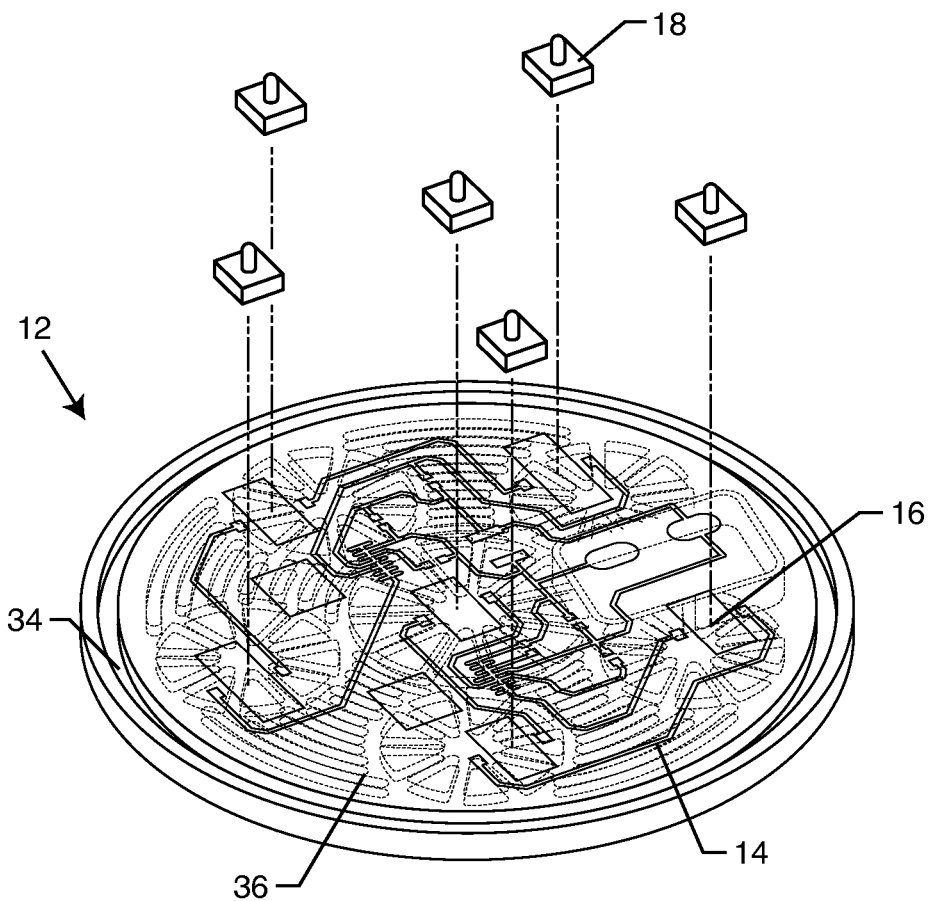
FIG. 3 is a top perspective view of a base, having heat dissipating fins shown in phantom, with LEDs thereof exploded from LED circuit trace landings.
Figure 4:
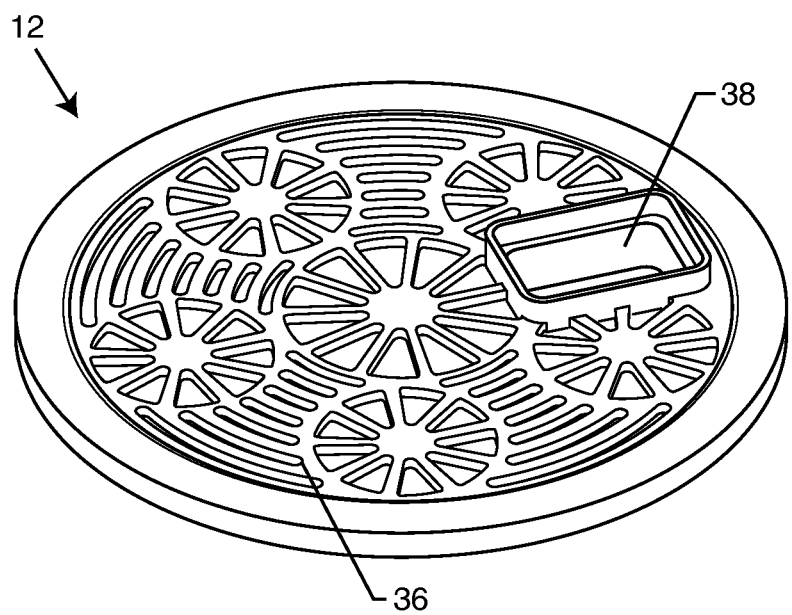
FIG. 4 is a bottom perspective view of the base of FIG. 3, illustrating heat dissipating fins thereof.

With reference now to FIGS. 3 and 4, in a particularly preferred embodiment, the base 12 comprises a heat sink. As described above, aluminum alloy metals are extremely heat efficient at conducting heat. As will be more fully described herein, forming the circuit traces 14 and attaching the LEDs 18 directly onto the surface of the heat sink base 12 efficiently and effectively removes the heat from the LEDs 18, thus prolonging their useful life and maintaining their light output. Preferably, when the heat sink base 12 is formed, heat dissipating fins 36, grooves, etc., are formed in the base 12 to facilitate the heat dissipation therefrom. Typically, such fins or grooves 36 are formed on an opposite surface of the circuit traces 14. Appropriate sockets or apertures 38 are formed in the base 12 as well, such as for receiving the plug 20, electrical leads, etc. for powering the electrical components and LEDs 18.

It will readily be understood by those skilled in the art that the LEDs 18 can comprise white LEDS and the lens 28 or 32 can comprise a clear lens so as to maintain the white light, or an amber, red, or other colored lens to impart a colored light. Alternatively, the LEDS 18 can emit colored light, such as yellow, red, etc. and the lens 28 or 32 be clear. This is particularly the case for vehicle tail-light assemblies. However, in other applications, a lens 28 or 32 may not be necessary at all.

Figure 5:
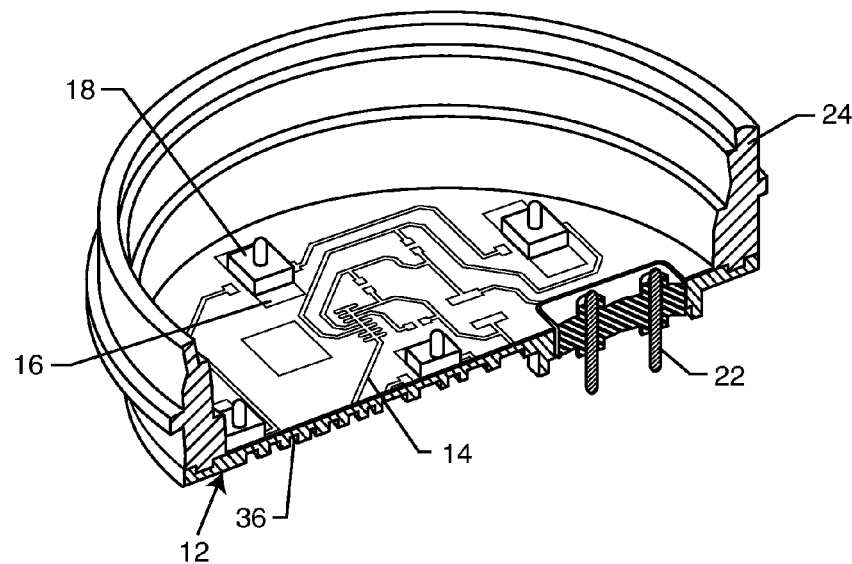
FIG. 5 is a cross-sectional view of a partially constructed assembly of FIG. 1.
Figure 6:
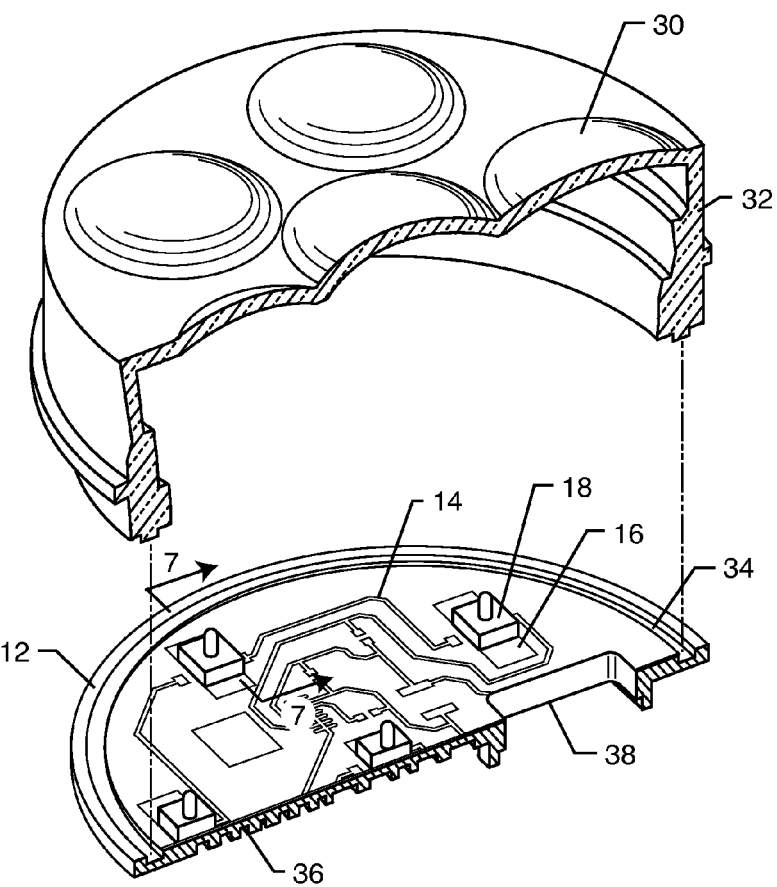
FIG. 6 is a partially exploded cross-sectional view of components of the embodiment illustrated in FIG. 2.

With reference now to FIGS. 5 and 6, the cross-section views of the partial assemblies 10 and 10' illustrate the formation of the circuit traces 14 and placement of LEDs 18 directly onto the aluminum heat sink base 12. The coupling of the housings 24 or 32 into the peripheral groove 34 of the base 12 is also shown.

Figure 7:
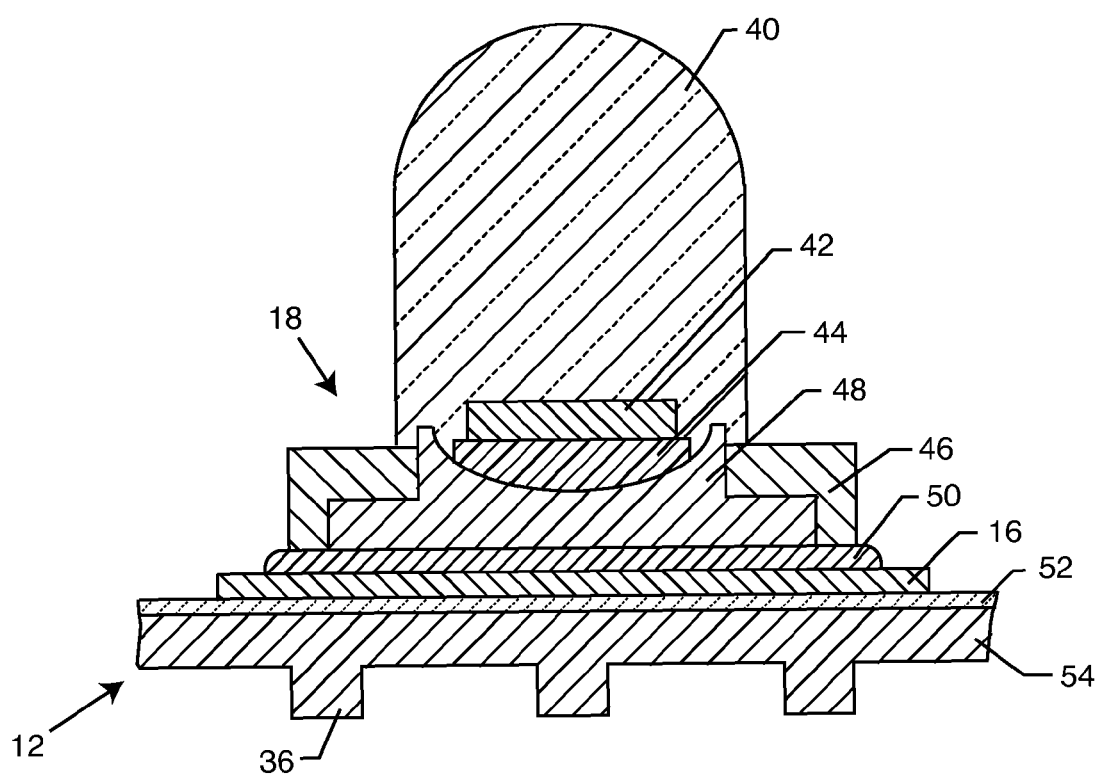
FIG. 7 is an enlarged cross-sectional view taken generally along line 7-7 of FIG. 6, illustrating the metal-to-metal connection of an LED to an underlying heat sink base, in accordance with the present invention.

With reference now to FIG. 7, an enlarged cross-sectional view taken generally along line 7-7 of FIG. 6 is shown, although it will be understood that the same arrangement is found in FIG. 5. The LED 18 is typically comprised of a lens 40, which can comprise a plastic material, which surrounds and substantially encapsulates the light generating chip 42 of the LED 18. A sub-mount chip 44 may underline the chip 42. A base 46, typically comprised of electrically non-conductive material, is also usually provided. It will be appreciated by those skilled in the art that the exact design arrangement between the various LEDS may vary somewhat, and the foregoing has been provided for exemplary purposes. Typically, electrical leads (not shown) will extend from the chip 42 to an outer surface of the LED 18, for electrical connection to circuit traces and the like.

Many of the LEDS, particularly the newer versions, include a heat sink 48 which underlies the one or more chips 42 and 44 which generate the light. The heat sinks are comprised of a thermally conductive material, such as aluminum or copper, and are intended to draw away the heat from the chips 42 or 44 so as not to overheat and degrade or even destroy the chips 42, and thus the LED 18. The heat sink slug 48 typically extends to a lower surface of the LED 18.

In accordance with the present invention, electrically conductive metallic solder 50 is placed on the LED landing 16. The LED 18 is then placed on the solder 50 by any conventional means, including by hand, pick and place robotic machinery, etc. Moreover, the solder 50, which is typically a tin alloy including led, copper, silver, or any other electrically conductive metallic solder, can be applied by any conventional means, including silk screening, etc.

The result of this design is that the heat generated by the LED 18 is conducted away from the chips 42 and 44 by the heat slug 48. The heat slug 48 has a metal-to-metal contact with the metallic solder 50, and thus the heat is transferred efficiently to the solder 50, and to the metallic circuit trace LED landing 16. As the metallic LED circuitry landing 16 is in direct contact with the anodized layer 52 of the aluminum 54 base 12, the heat is efficiently transferred into the aluminum base 54 so as to be dissipated, such as through the fins 36, housing 24, 32, etc. It will be appreciated by those skilled in the art that there are no thermally insulative layers between the LED heat sink slug 48 and the heat sink base 12.

Figure 8:
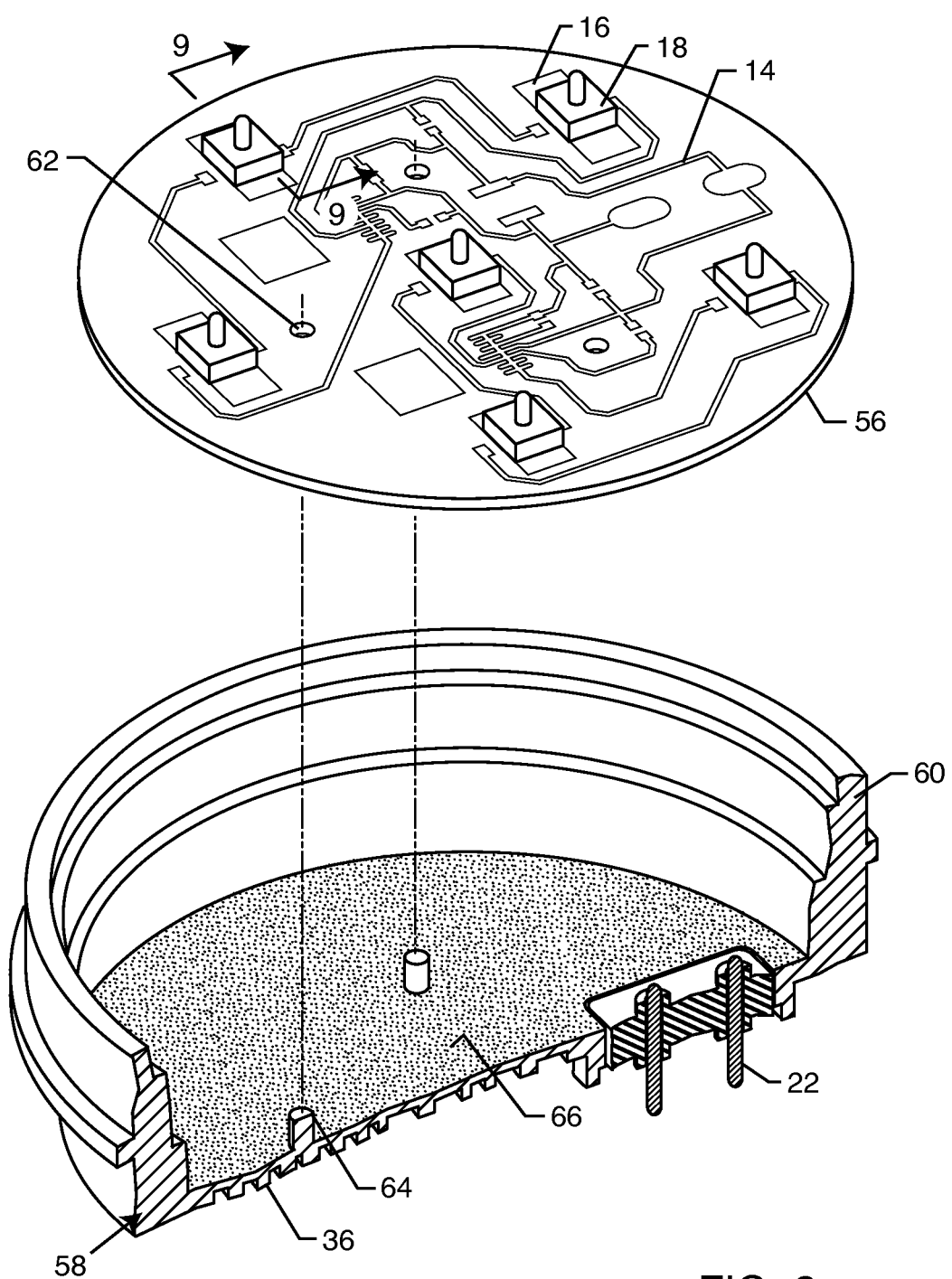
FIG. 8 is a partially sectioned and exploded perspective view of another LED lamp assembly manufactured in accordance with the present invention.

With reference now to FIG. 8, in the foregoing illustrations, the base 12 comprised the heat sink. However, this may need not be the case. For example, a base 56 comprised of electrically and thermally conductive material, such as aluminum, can have at least a portion, such as an upper surface thereof, anodized to form an electrically insulating coating. Typically, the base 56 is comprised 100% of a homogenous aluminum or aluminum alloy material, and at least top surface is anodized to form an aluminum oxide coating thereon. Circuit traces 14 and LED landings 16 are formed thereon, as described above, and the LEDs 18 soldered thereon using the metallic solder, as described above. It will be understood by those skilled in the art that the LED 18 will actually be pulled toward the surface of the LED landing 16 as the solder is cured. Thus, the LED 18 is firmly affixed to the LED landing 16.

In this particular embodiment, the base 56 is coupled to a separate heat sink 56, which may also include the heat dissipating fins 36 and the like. As illustrated in FIG. 8, the heat sink 56 includes an upwardly extending peripheral wall 60, which serves as a housing. However, it should be understood that the housing can be separately connected to the underlying heat sink 58. The base is disposed within the wall 60 so as to rest on an upper surface of the heat sink 58. The base 56 may include apertures 62 for receipt of bolts, screws, etc., so as to affix the base 56 and heat sink 58 to one another. Projections 64 may extend upwardly from the adhesive 58 for frictional insertion through and engagement with these apertures 62.

Even with such a connection, there exists the possibility of a thin layer or pockets of air between the aluminum base 56 and heat sink 58. Accordingly, a heat conductive paste 66 is disposed between the base 56 and heat sink 58 to fill any gaps therebetween. Preferably, the paste 66 is a heat conductive metallic-based paste.

Figure 9:
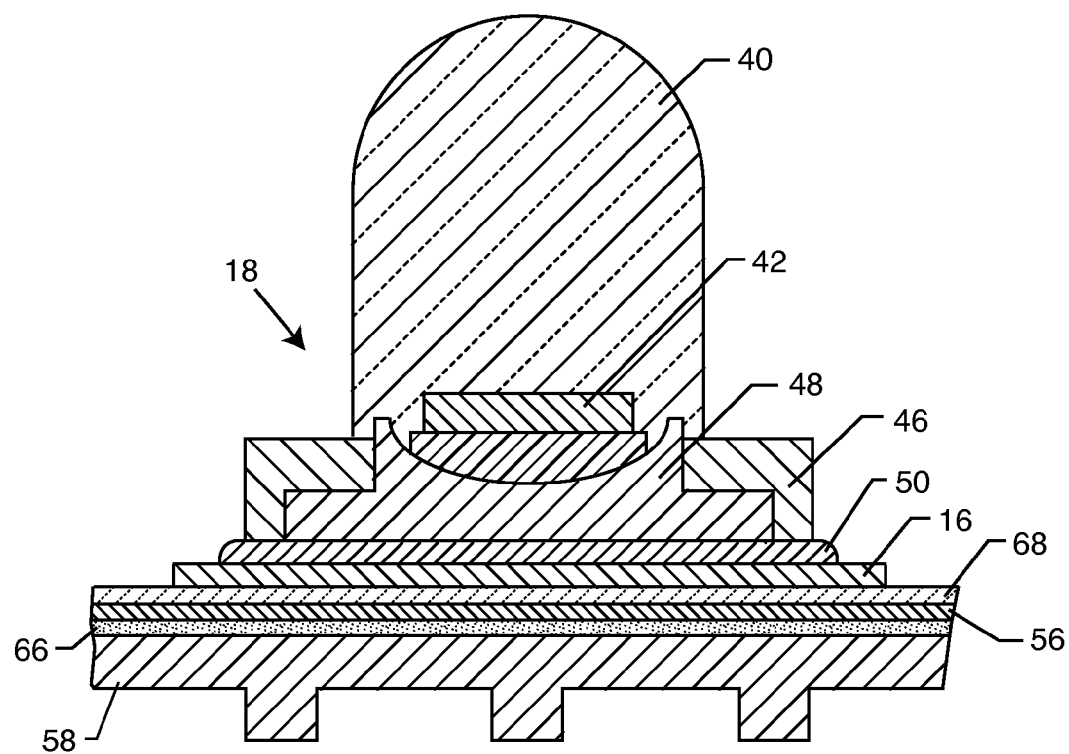
FIG. 9 is an enlarged cross-sectional view taken generally along line 9-9 of FIG. 8, illustrating the thermally conductive pathway from the LED to an underlying heat sink in accordance with the present invention.

With reference now to FIG. 9, the LED 18, is electrically and mechanically attached to the LED circuit trace landing 16 by means of metallic solder 50. As discussed above, the circuit trace landing 16 is formed directly on the anodized layer 68 of the aluminum base 56. The base 56 is coupled to the heat sink 58 by means of the heat conductive metallic paste 66. Thus, an efficient and effective metal-to-metal heat conductive pathway is formed between the LED heat sink slug 48 and the heat sink 58.

Figure 10:
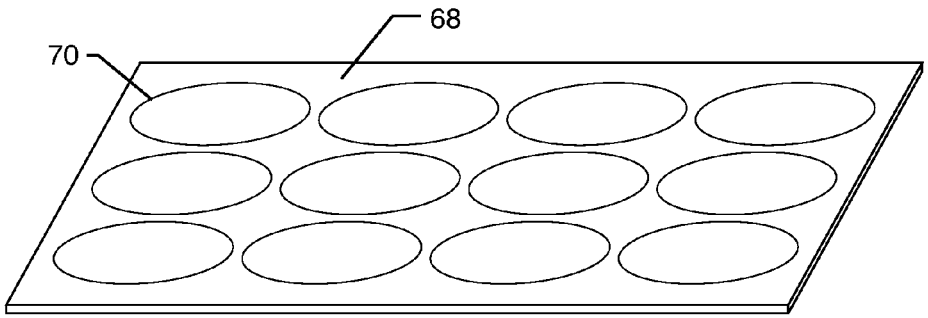
FIG. 10 is a perspective view of a thermally conductive sheet of metal, used in creating bases in accordance with the present invention.
Figure 11:
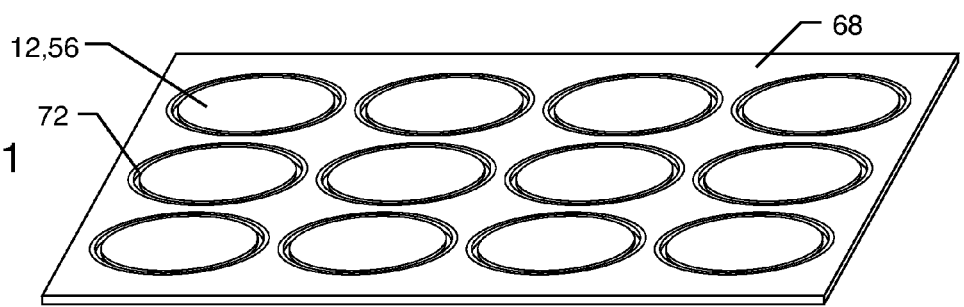
FIG. 11 is a perspective view illustrating the formation of such bases.

With reference now to FIGS. 10-13, a process for making the bases 12 or 56 is shown. In one method of manufacturing these in accordance with the present invention, a sheet of the electrically thermally conductive base material, such as aluminum or aluminum alloy, 68 is provided which can form a plurality or an array of the bases 12 or 56. The outer periphery of the bases 12 and 56 is then formed, such as by a stenciled line 70, as illustrated in FIG. 10, or a groove 72, as illustrated in FIG. 11. At least the upper surface of the sheet 68 of aluminum is anodized to create the electrically insulating layer. The aluminum sheet 68 is then dipped in an etching solution, i.e., isoprep, for a few minutes. The etching solution chemically etches and softens the anodized layer. The aluminum sheet 68 is then dried in an oven for about five minutes to remove any excess moisture.

Figure 12:
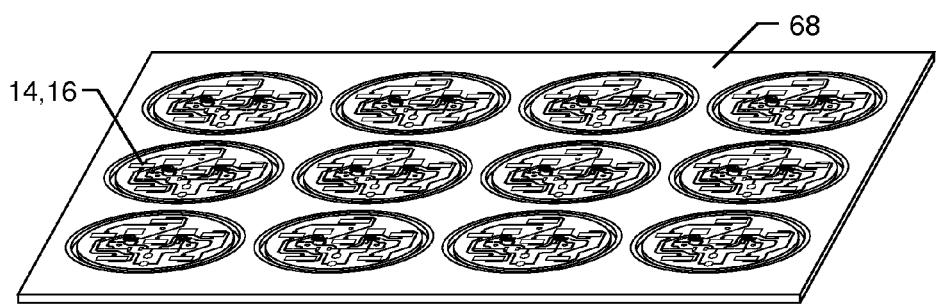
FIG. 12 is a perspective view illustrating the formation of electronic circuit traces and components on the bases.
Figure 13:
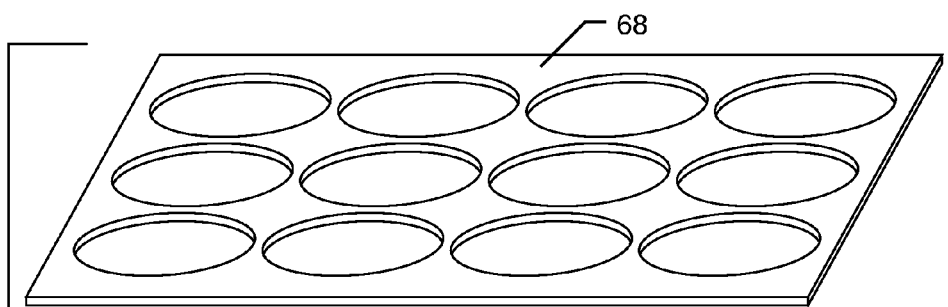
FIG. 13 is a perspective view illustrating the removal of the bases from the sheet, in accordance with the present invention.
Figure 13:
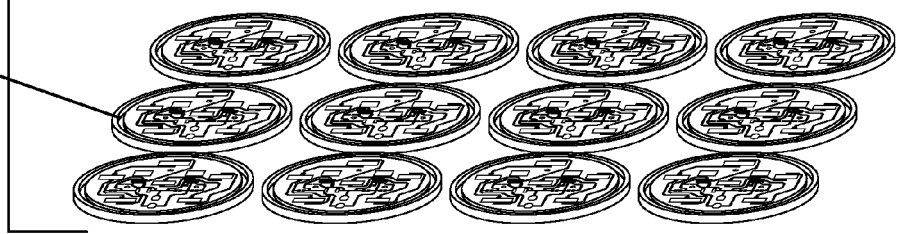

The necessary circuit traces 14 and LED circuit trace landing 16 are then formed on the bases 12 or 56, in any conventional manner, as described above. The circuit traces 14 are preferably an electrically conductive silver/copper paste. The silver/copper paste is screened onto the anodized surface and baked for about thirty minutes at about 175° Celsius. Preferably, the electronic components, between the LEDS 18 are also affixed to the circuit traces 14, etc., at this stage as well. This would be beneficial, as the bases 12 or 56 are presented in organized array such that the electronic components can be properly placed by pick and place machinery and the like. After these components have been formed on the bases 12 or 56, as illustrated in FIG. 12, they are cut out or otherwise removed from the aluminum sheet 68, as illustrated in FIG. 13.

Applicant discovered that it was not a straight forward process to adhere or screen electrically conductive materials (pastes, inks) to anodized surfaces, particularly aluminum. The conductive pastes, which are silver or copper particles suspended in a polymer based material have different coefficients of thermal linear expansion than the aluminum substrate. The coefficient of thermal linear expansion of aluminum is $2.4 \times 10^{-5}$ per 1° C. The coefficient of thermal linear expansion of copper is $1.7 \times 10^{-5}$ per 1° C. The difference in these coefficients is thirty percent, which means that the aluminum expands linearly faster than copper. Baking the screened circuit traces 14 in a 175° C. oven causes the copper paste to break away and depart from the anodized surface. This effect is increased because the circuit trace 14 is relatively much thinner and has less body mass than the aluminum sheet 68. In the heat of the oven, the circuit traces 14 dry rapidly, crystallize, and do not retain heat while the aluminum sheet expands faster and holds heat longer due to its mass. These differences result in a situation where the aluminum sheet 68 stays expanded while the circuit traces 14 contract because they cool faster. Thus, the circuit traces 14 are damaged while in the oven and during subsequent cooling.

Since the anodizing process does not create a smooth surface, the effect of the disparity in linear expansion is exacerbated. When viewed under a microscope, the anodized layer is a very rough surface that looks like a sponge with millions of pores, tentacles and ridges. Applicant discovered that when the anodized layer is dipped into the etching solution, the anodized layer softens—becoming more flexible and stickier. This improved softness, flexibility and stickiness allows the circuit traces 14 to more reliably and securely adhere to the anodized layer, including getting deep into the pores of the anodized layer. The heating process also softens the circuit traces 14 causing them to more readily recess into the softened anodized layer and adhere more easily. If the anodized layer is not treated with etching solution prior to applying the circuit traces 14, applicant found that the circuit traces 14 and other electrical components, i.e., LEDs 18, would easily fall or scrape off of the anodized layer because of poor adhesion.

Treatment of the anodized layer with etching solution was not an obvious solution to the problem of getting the circuit traces 14 to adhere to the anodized surface. Since the anodizing process does not create a smooth surface, it does not have a uniform thickness. One skilled in the art would realize that dipping the aluminum sheet 68 in the etching solution for a few minutes can create voids or holes in the anodized layer, particularly where the anodized layer is thinner. If the circuit traces 14 are placed over these voids or holes, they would make contact with the underlying aluminum sheet 68 and short out.

It will be appreciated by those skilled in the art that the bases 12 or 56 may be created by other techniques, and then placed in a stencil designed to accommodate a plurality of the bases 12 or 56, such that the necessary circuit traces 14, electronic components, etc., can be added thereto as needed by pick and place machinery, etc. Of course, instead of being performed in an automated fashion, this can also be performed manually, in which case the stencils are not needed.

Although several embodiments have been described in detail for purposes of illustration, various modifications may be made to each without departing from the scope and spirit of the invention. Accordingly, the invention is not to be limited, except as by the appended claims.

What is claimed is:

1. A method for manufacturing an LED lamp assembly, comprising the steps of:
    anodizing at least a portion of a surface of an electrically and thermally conductive base so as to form an electrically insulating coating;
    dipping the base in an etching solution so as to etch and soften the anodized surface;
    forming circuit traces on the anodized surface of the base to establish discrete and electrically conductive paths for electrically interconnecting electronic components, the circuit traces including at least one LED landing; and
    electrically and mechanically attaching an LED directly to the LED landing by means of conductive metallic solder, whereby heat generated from the LED is transferred through the solder and LED landing to the base.

2. The method of claim 1, wherein the base is comprised of aluminum or an aluminum alloy, and the anodizing step includes the step of forming an aluminum oxide coating on the base.

3. The method of claim 2, wherein the base comprises a heat sink.

4. The method of claim 3, including the step of forming heat dissipating fins with the base.

5. The method of claim 4, wherein the fins extend from a surface of the base generally opposite the circuit traces.

6. The method of claim 2, including the step of coupling the base to a heat sink.

7. The method of 6, including the step of disposing a heat conductive material between the base and the heat sink.

8. The method of claim 7, wherein the heat conductive material comprises a metallic-based paste.

9. The method of claim 1, wherein the metallic solder comprises an alloy material of tin with lead, copper or silver.

10. The method of claim 1, further comprising the steps of: drying the base in an oven to remove excess moisture after the dipping step; and baking the base in an oven at about 175° C. for about thirty minutes after the forming step.

11. The method of claim 1, including the step of disposing a lens and a reflector over the LED, the lens and reflector cooperatively dispersing light emitted from the LED.

12. A method for manufacturing an LED lamp assembly, comprising the steps of:
    anodizing at least a portion of a surface of an electrically and thermally conductive aluminum or aluminum alloy base comprising a heat sink so as to form an electrically insulating aluminum oxide coating thereon;

dipping the heat sink base in an etching solution so as to etch and soften the anodized surface;

forming circuit traces on the anodized surface of the heat sink base to establish discrete and electrically conductive paths for electrically interconnecting electronic components, the circuit traces including at least one LED landing; and electrically and mechanically attaching an LED directly to the circuit trace LED landing by means of conductive metallic solder, whereby heat generated from the LED is transferred through the solder and LED landing to the heat sink base.

13. The method of claim 12, including the step of forming heat dissipating fins with the base.

14. The method of claim 13, wherein the fins extend from a surface of the base generally opposite the circuit traces.

15. The method of claim 12, wherein the metallic solder comprises an alloy material of tin with lead, copper or silver.

16. The method of claim 12, further comprising the steps of:

drying the heat sink base in an oven to remove excess moisture after the dipping step; and baking the heat sink base in an oven at about 175° C. for about thirty minutes after the forming step.

17. The method of claim 12, including the step of disposing a lens and a reflector over the LED, the lens and reflector cooperatively dispersing light emitted from the LED.

18. A method for manufacturing an LED lamp assembly, comprising the steps of:

anodizing at least a portion of a surface of an electrically and thermally conductive aluminum or aluminum alloy metal base so as to form an electrically insulating aluminum oxide coating;

dipping the metal base in an etching solution so as to etch and soften the anodized surface;

forming circuit traces on the anodized surface of the metal base to establish discrete and electrically conductive paths for electrically interconnecting electronic components, the circuit traces including at least one LED landing;

electrically and mechanically attaching an LED directly to the circuit trace LED landing by means of conductive metallic solder;

coupling the metal base to a metal heat sink; and disposing a heat conductive material between the metal base and the heat sink, whereby heat generated from the LED is transferred through the solder, LED landing and metal base to the heat sink.

19. The method of claim 18, wherein the heat conductive material comprises a metallic-based paste.

20. The method of claim 18, wherein the metallic solder comprises an alloy material of tin with lead, copper or silver.

21. The method of claim 18, further comprising the steps of:

drying the heat sink base in an oven to remove excess moisture after the dipping step; and baking the heat sink base in an oven at about 175° C. for about thirty minutes after the forming step.

22. The method of claim 18, including the step of disposing a lens and a reflector over the LED, the lens and reflector cooperatively dispersing light emitted from the LED.

* * * * *